United States Patent
Lin et al.

(10) Patent No.: US 10,628,541 B2
(45) Date of Patent: Apr. 21, 2020

(54) METHOD AND APPARATUS FOR SELECTING INTEGRATED CIRCUIT DEVICE NEURAL NETWORK MODELING SAMPLE

(71) Applicant: PEKING UNIVERSITY SHENZHEN GRADUATE SCHOOL, Shenzhen (CN)

(72) Inventors: Xinnan Lin, Shenzhen (CN); Zhiyuan Zhang, Shenzhen (CN)

(73) Assignee: PEKING UNIVERSITY SHENZHEN GRADUATE SCHOOL, Shenzhen (CN)

( * ) Notice: Subject to any disclaimer, the term of this patent is extended or adjusted under 35 U.S.C. 154(b) by 29 days.

(21) Appl. No.: 16/073,322

(22) PCT Filed: Aug. 29, 2017

(86) PCT No.: PCT/CN2017/099514
§ 371 (c)(1),
(2) Date: Jul. 26, 2018

(87) PCT Pub. No.: WO2018/054198
PCT Pub. Date: Mar. 29, 2018

(65) Prior Publication Data
US 2019/0042681 A1 Feb. 7, 2019

(30) Foreign Application Priority Data
Sep. 23, 2016 (CN) .......................... 2016 1 0846024

(51) Int. Cl.
*G06F 11/22* (2006.01)
*G06F 17/50* (2006.01)
(Continued)

(52) U.S. Cl.
CPC ....... *G06F 17/5036* (2013.01); *G05B 13/027* (2013.01); *G06N 3/08* (2013.01); *G06F 17/5045* (2013.01)

(58) Field of Classification Search
USPC .......................... 716/106, 107, 111, 132, 136
See application file for complete search history.

(56) References Cited

U.S. PATENT DOCUMENTS 2,552,013 A * 5/1951 Orpin ....................... H03K 9/08
340/12.14
3,233,084 A * 2/1966 Kendall ............... G08G 1/0104
701/118
(Continued)

FOREIGN PATENT DOCUMENTS

| CN | 105488297 A | 4/2006 |
|---|---|---|
| CN | 105005822 A | 10/2015 |
| CN | 106446405 A | 2/2017 |

OTHER PUBLICATIONS

International Search Report for PCT/CN2017/099514 dated Aug. 29, 2017 and its English translation from Google Translate.
(Continued)

*Primary Examiner* — Brian Ngo
(74) *Attorney, Agent, or Firm* — Ladas & Parry, LLP (57) ABSTRACT

A method and apparatus for selecting an integrated circuit device neural network modeling sample; for an input variable having the largest mean impact value, by means of continually and equally dividing an interval of the input variable, until relative errors of all divided intervals are equal to or less than a preset error precision, only at which point the equal division action stops, and the length of the divided interval having the smallest length being taken as a step length of the output variable; the step lengths of other input variables then being respectively calculated, according to the step length of the input variable; and finally, for each
(Continued)

input variable, points being extracted according to a change interval and the step length thereof, thereby obtaining a sample point set of each input variable. Thus, a low amount of sample data may be selected under the condition of a given precision, the low sample data amount further saving testing expenditures required by device modeling, and increasing the training speed of a neural network.

10 Claims, 4 Drawing Sheets

(51) Int. Cl.
*G05B 13/02* (2006.01)
*G06N 3/08* (2006.01)

(56) References Cited

U.S. PATENT DOCUMENTS

| | | | | |
|---|---|---|---|---|
| 3,502,855 A * | 3/1970 | Liden | | G06G 7/1806 708/804 |
| 4,451,847 A * | 5/1984 | Young | | H04N 5/232 340/12.1 |
| 5,806,053 A | 9/1998 | Tresp et al. | | |
| 5,828,784 A * | 10/1998 | Miyashita | | G06T 9/40 382/232 |
| 6,272,664 B1 * | 8/2001 | Chang | | G06F 17/5022 703/2 |
| 6,920,602 B1 * | 7/2005 | Park | | H03M 13/27 341/51 |
| 2013/0246986 A1 * | 9/2013 | Kuo | | G06F 17/5036 716/106 |
| 2016/0034632 A1 * | 2/2016 | Inoue | | G03F 1/84 716/53 |

OTHER PUBLICATIONS

Written Opinion of the International Searching Authority for PCT/CN2017/099514 dated Aug. 29, 2017 and its English translation from Google Translate.

* cited by examiner

METHOD AND APPARATUS FOR SELECTING INTEGRATED CIRCUIT DEVICE NEURAL NETWORK MODELING SAMPLE

CROSS-REFERENCE TO RELATED APPLICATIONS

The present application is the U.S. national phase of PCT Application PCT/CN2017/099514 filed on Aug. 29, 2017 which claims a priority to the Chinese patent application No 201610846024.8 filed on Sep. 23, 2016, the disclosures of which are incorporated herein by reference in their entireties

TECHNICAL FIELD

The pressure disclosure relates to modeling in integrated circuit device, particularly to methods and apparatus for selecting artificial neural network, modeling sample in integrated circuit device.

BACKGROUND

With the development of integrated circuit (IC) technology, the feature size of an IC device is decreasing. Many simplifications and assumptions have been made on actual devices by traditional device models which are based on semi-empirical and half-device physics. Such modeling methods were feasible in practice in the past. However, it will bring lots of new physical effects as device sizes continue to reduce; in this way, models will be complicated with a traditional modeling method, or even modeling for some new devices will become impossible.

There has been a method for modeling IC with artificial neural networks (ANNs) at present. ANNs are based on a collection of artificial neurons which is abstracted from information processing to establish simple models formed to be various networks with different connection methods. By learning from training samples, an ANN may obtain a corresponding "knowledge" and fit approximately whichever nonlinear function; therefore it can be applied to the modeling of IC devices. In the process of modeling using ANNs, many factors, including selection of training samples, training weights, initialization of thresholds, configuration of ANN and optimization of training algorithms, may have an effect on a final result. What is concerned herein is the selection of training samples. The size of the training samples should not be too small or too large.

Inaccurate learning by ANN may be caused by a too small sample size, affecting the accuracy of the final result.

Where the size of the training samples is too large, over-fitting may be produced, making the extrapolation and interpolation of ANN very bad, and leading to inaccurate predictions with the training samples. In this case, the burden of training increases, causing a much more time-consuming training, and even an exponential growing in time cost with a more complex ANN structure. Further, a too large training sample size may multiply test overhead and the cost for modeling.

Therefore, how to select training samples for modeling IC with ANNs is vital.

SUMMARY OF THE INVENTION

The present application may provide a method and an apparatus for selecting neural network modeling samples for an integrated circuit device.

according to a first aspect of the present application, a method for selecting neural network modeling samples for an integrated circuit device is provided in the present application, comprising:

determining one or more input variables, output variables and a change interval of each input variable for the integrated circuit device to be modeled;

computing a mean impact value of each input variable separately;

for the input variable having the largest mean influence value, computing a relative error of its change interval, when the relative error is less than or equal to a preset error precision, using the length of the change interval of the input variable as the step length of the input variable; when the relative error is greater than the error precision, dividing the change interval of the input variable into two sub-intervals, and computing the relative errors of the two sub-intervals respectively; when there is a sub-interval whose relative error is greater than the preset error precision, continually and equally dividing it into two sub-intervals and computing relative errors of the two sub-intervals respectively until the relative errors of all the sub-intervals are less than or equal to the preset error precision, at this point, stopping equally dividing, and taking the length of the sub-interval having the smallest interval length as the step length of the input variable;

according to the step length of the input variable having the largest mean influence value, computing the step lengths of other input variables respectively; and for each input variable, taking points based on its change interval and step length to obtain a sample point set for each input variable.

In an embodiment, the step of computing the relative error of an interval for an input variable comprises:

by means of an actual test, obtaining the test values corresponding to the output variables when the input variable are set to be the left end point, the middle point, and the right end point of the interval respectively;

computing a mean value of the abovementioned test values corresponding to the output variables when the input variables are set to be the left end point and the right end point of the interval; and computing a relative error between the mean value and the test value corresponding to the output variable when the input variable is set to be the middle point of the interval.

According to a second aspect of the present application, an apparatus for selecting neural network modeling samples for an integrated circuit device is provided in the present application, comprising:

a determining module configured for determining one or more input variables, output variables and a change interval of each input variable for the IC device to be modeled;

a mean influence value computing module configured for computing a mean impact value of each input variable separately;

a first step length computing module configured for computing a relative error of the change interval for the input variable having the largest mean influence value, when the relative error is less than or equal to a preset error precision, using the length of the change interval of the input variable as the step length of the input variable; when the relative error is greater than the error precision, dividing the change interval of the input variable into two sub-intervals, and computing the relative errors of the two sub-intervals respectively; when there is a sub-interval whose relative error is greater than the preset error precision, continually and equally dividing it into two sub-intervals and computing relative errors of the two sub-intervals respectively until the relative errors of all the sub-intervals are less than or equal to the preset error precision, at this point, stopping equally dividing and taking the length of the sub-interval having the smallest interval length as the step length of the input variable;

an other step length computing module configured for computing the step lengths of other input variables respectively according to the step length of the input variable having the largest mean influence value; and a sampling module configured for taking points based on the change interval and step length of each input variable to obtain a sample point set for each input variable.

In an embodiment, the first step length computing module comprises a relative error computing module configured for computing the relative error of an input variable on an interval, the relative error computing module comprises:

an output value testing module configured for obtaining the test values corresponding to the output variables by means of an actual test when the input variable are set to be the left end point, the middle point, and the right end point of the interval respectively a mean value computing module configured for computing a mean value of the abovementioned test values corresponding to the output variables when the input variables are set to be the left end point and the right end point of the interval; and a calculating sub-module configured for calculating a relative error between the mean value and the test value corresponding to the output variable when the input variable is set to be the middle point of the interval.

According to the method and the apparatus for selecting neural network modeling samples for an integrated circuit device, for an input variable having the largest mean impact value, by means of continually and equally dividing an interval of the input variable, until relative errors of all divided intervals are equal to or less than a preset error precision, only at which point the equal division action stops, and the length of the divided interval having the smallest length being taken as a step length of the output variable; the step lengths of other input variables then being respectively calculated, according to the step length of the input variable; and finally, for each input variable, points being extracted according to a change interval and the step length thereof, thereby obtaining a sample point set of each input variable. Thus, a low amount of sample data may be selected under the condition of a given precision, the low sample data amount further saving testing expenditures required by device modeling, and increasing the training speed of a neural network.

BRIEF DESCRIPTION OF THE DRAWINGS

FIG. 5 is a training result diagram, in which FIG. 5(a) is a comparison diagram of the output variables $I_{ds}$ to the input variables $V_{ds}$ between a result from modeling test and a result from actual test, and FIG. 5(b) is a comparison diagram of the output variables $I_{ds}$ to the input variables $V_{gs}$ between a result from modeling test and a result from actual test.

DETAILED EMBODIMENTS

In prior art, like "Algorithm of Neural Network Training Data Generation Used in Automatic Modeling of Microwave Applications" written by Lin Hui, three methods, including a first traditional way and a second and a third improved ways, have been summarized for the selection of ANN training samples used to model IC. As to the first traditional way, known as random sampling, a large number of sampling points is needed, which results in an extremely high cost on data acquisition. The second and third improved ways may reduce the number of sampling points, but, due to an standard error as a training target introduced in the process, and due to not taking logarithm on the test result, they may fail to balance the number of sampling points and the requirement of the accuracy of the training result when dealing with selection of training samples in a large order of magnitude. Furthermore, the two methods may perform a standard error calculation on all divided sub-intervals and sort them to obtain the maximum standard error during each calculation iteration. When the scale is rather large, the time complexity of the algorithm will increase significantly. So there is a need to provide a new method to deal with the selection of training samples.

Figure 1:
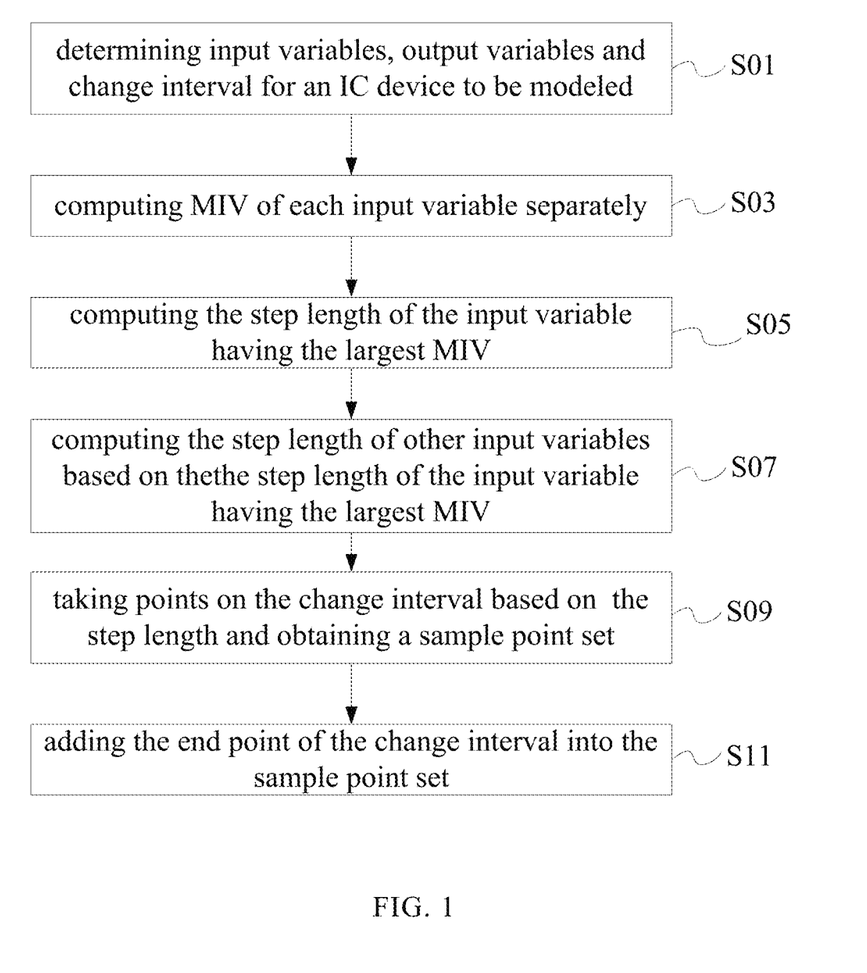
FIG. 1 is a flow chart of a method for selecting neural network modeling samples for an IC device according to an embodiment of the present application.

Referring to FIG. 1, a method for selecting neural network modeling samples for an IC device (hereinafter referred to as a sample selection method) which may include steps S01 to S11 is disclosed in the present application.

Step S01: determining one or more input variables, output variables and a change interval of each input variable for the IC device to be modeled. The input variables and the output variables may be different due to various kinds of IC devices; and the change interval of each input variable may also be varied even if the input variables and output variables are the same. For example, for a device A, its normal working interval of an input variable $V_{ds}$ is 0.3V to 1.2V, and the normal working interval of an input variable $V_{gs}$ is −0.1V to 0.6V; and for a device B, its normal working interval of the input variable $V_{ds}$ is 300V to 1200V, and the normal working interval of the input variable $V_{gs}$ is −0.8V to 0.2V. When modeling an IC device, the normal working intervals will definitely to be modeled, and the interval of the input variables corresponding to non-conceived and meaningless electrical characteristic interval will be ignored: therefore, in the first step of modeling, it is necessary to determine the input variables, the output variables, and the change intervals of the input variables of the IC device to be modeled. The specific number of the input variables is depended on the IC device to be modeled, and the change intervals of the input variables are generally the normal working intervals of the input variables of the IC device to be modeled.

Step S03: computing a mean impact value (MIV) of each input variable separately. It is noted that the sign of MIV represents the relevant direction of the impact, and the absolute value represents the relative importance of the impact. The larger the absolute value of the MIV, the greater the relative importance of the impact. The comparison between or calculation of the MIV as described below refers to the MIV itself without sign, that is, the absolute value. For example, where a MIV is −1 and another MIV is 0.1, when comparing both MIV, the value 1 is compared with the value 0.1, and the result is that the MIV of −1 is larger than the MIV of 0.1.

Step S05: computing the step length of the input variable having the largest MIV. In an embodiment, referring to FIG. 2, step S05 may include steps P01 to P13.

Figure 2:
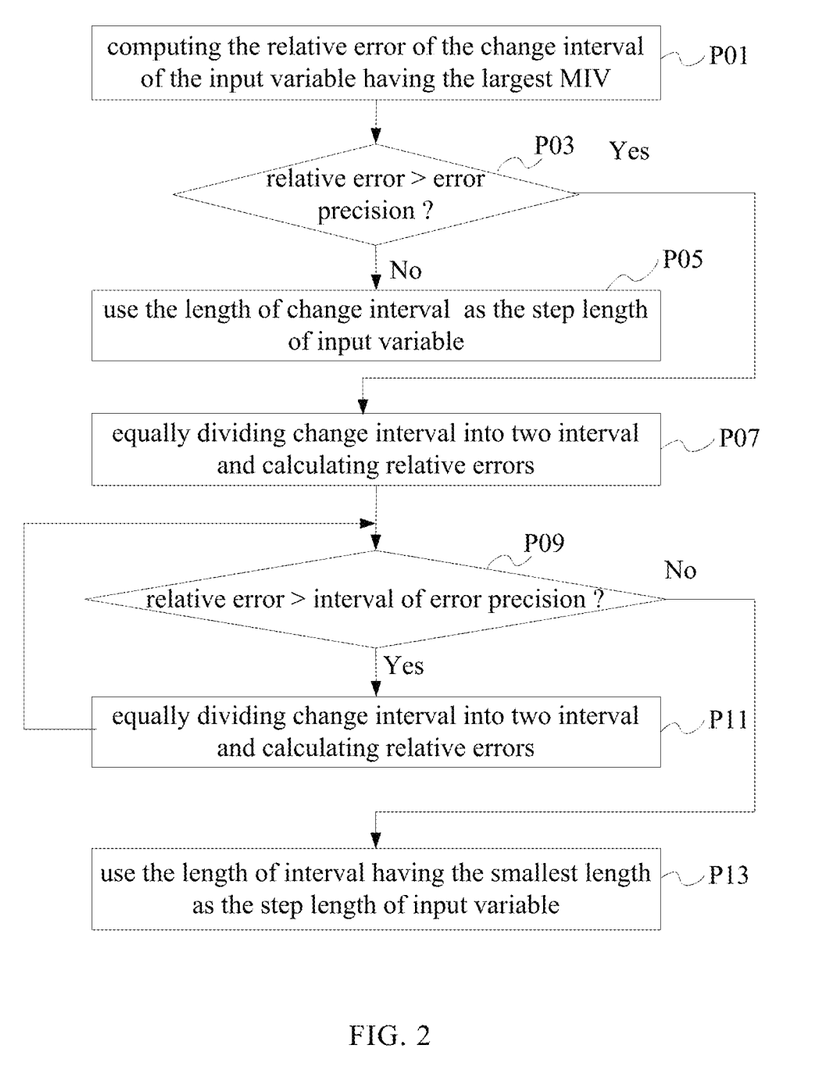
FIG. 2 is a flow chart of calculating a size length of an input variable having the largest mean influence value in a method for selecting neural network modeling samples for an IC device according to an embodiment of the present application.

Step P01: computing a relative error of the change interval for the input: variable with the largest MIV.

Step P03: comparing the relative error with a preset error precision, if the relative error is less than or equal to the preset error precision, proceeding to step P05 and using the length of the change interval as the step length of the input variable, otherwise proceeding to step P07.

Step P07: when the relative error is greater than the error precision, equally dividing the change interval of the input variable into two sub-intervals, and computing the relative errors of the two sub-intervals respectively.

Step P09: judging whether there is a subinterval whose relative error is greater than the preset error precision.

Step P11: when there is a sub-interval whose relative error is greater than the preset error precision, continually and equally dividing it into two sub-intervals and computing relative errors of the two sub-intervals respectively until the relative errors of all the sub-intervals are less than or equal to the preset error precision, at this point, stopping equally dividing.

Step P13: taking the length of the sub-interval having the smallest interval length as the step length of the input variable.

In the process of computing the step length above, the comparison between the relative error with the error precision refers to compare the unsigned value of the two, i.e., the absolute value, because the positive and negative signs of the relative error are only the direction representing the error, and do not represent the value of the error.

In steps P01 to P13, the relative error of an interval for an input variable may be computed as follows:

First, when the input variable are set to be the left end point, the middle point, and the right end point of the interval respectively, by means of an actual test, the test values corresponding to the output variables can be obtained. Since the output variables determined in step S01 is affected by each input variable and a single input variable fails to determine the value of the output variable, during the actual test under which the test values corresponding to the output variables can be obtained when the input variables are set to be the left end, the middle and the right end points of the interval, other input variables may be set to be a fixed value in their own change intervals, and preferably, be the left end point or the right end point of their own change intervals.

Second, a mean value of the abovementioned test values corresponding to the output variables when the input variables are set to be the left end point and the right end point of the interval may be computed.

Third, a relative error between the mean value and the test value corresponding to the output variable when the input variable is set to be the middle point of the interval may be computed.

Depending on the electrical characteristics of the IC device, when modeling the IC device, the meaningful change interval of each input variable may correspond to an output variable whose value is in a large order of magnitude, generally greater than $10^5$. Thus, if the absolute error of the value of the output variable is directly used as a criterion of the error, the given standard absolute error value is difficult to meet the accuracy requirement of the output at different orders of magnitude, which will eventually result in taking too much or too little points in a certain interval. In this way, in a preferred embodiment, when computing the MIV in the second step and the relative error in the third step, a logarithmic operation may be taken firstly on the test value of the output variable.

In conclusion, the computation of the step length of the input variable in the steps P01 to P13 is to continually and equally divide the interval of the input variable until the relative errors of all the divided sub-intervals are less than or equal to the preset error precision, and to output the length of the sub-interval having the smallest length as the step length of the output variable. As to the relative error of the input variable in a certain interval, the specific computation thereof is to compute the mean value of the output variables corresponding to the input variable which is set at the left end and right end points respectively, and to compute the relative error between the mean value and the value of the output variables corresponding to the input variable which is set at the middle point. The reason for this is that, according to mathematical common sense, two different points can determine a straight line, so according to the input variables and the output variables corresponding to the two different points, information, about the input variables and the output variables corresponding to all the points in the interval between the two points may be acquired; similarly, if there is a curve between the two different points, the relative error between the mean value of the output variables corresponding to the two points and the output variable corresponding to the middle point of the two points may be within a certain range, thus information about the curve between the two points may be approximately represented by these two points.

Step S07: according to the step length of the input variable having the largest MIV, computing the step lengths of other input variables respectively. In an embodiment, the computation of the step length of any other input variable is to divide the MIV of the input variable having the largest MIV by the MIV of the input variable to be computed, and then multiply with the step length of the input variable having the largest MIV.

Step S09: for each input variable, taking points based on its change interval and step length to obtain a sample point set for each input variable.

Step S11: for each input variable, taking points based on its change interval and step length, when the end points of the change interval of the input variable fails to be taken, adding the end points of the change interval of the input variable into the sample point set of each input variable. Step S11 is an optional step, and the purpose of which is to maximize the information about the boundary, avoiding the loss of information at the boundary and misconvergence of the model.

The sample selection method of the present application will be described below by way of another example.

As described above, the input variables, the output variables and the normal working intervals of the input variables of different kinds of IC devices may be varied; therefore, it is necessary firstly to determine the input variables, the output variables and the change intervals of the input variables of an IC device to be modeled. Let us assume the determined input variables as $input_1$ and $input_2$, the output variable as output, the change interval of the input variable input$_1$ as [input$_{1L}$, input$_{1R}$], and the change interval of the input variable input$_2$ as [input$_{2L}$, input$_{2R}$].

Then, a small amount of input variables in the change interval and the corresponding output variables are uniformly tested to filter out the input variable having the greatest influence on the neural network output by using MIV method. The computed mean influence values of the input variables input$_1$ and input$_2$ are assumed to be MIV$_1$ and MIV$_2$ respectively. Let us assume that MIV$_1$ is greater than MIV$_2$, i.e., |MIV$_1$| is greater than |MIV$_2$|.

Next, the step length of the input variable having the largest MIV, i.e., the step length of the input variable input$_1$, may be computed. When the input variable input$_1$ is set to be the left end point input$_{1L}$, the right end point input$_{1R}$ and the middle point input$_{1M}$, the test values of the corresponding output variables of the IC device to be modeled, labeled as output$_L$, output$_R$ and output$_M$, may be obtained by a test device. It is noted that the value of the output variable output is affected by every input variable, input$_1$ and input$_2$, and a single input variable input$_1$ cannot determine the value of the output variable output. Therefore, during the actual test under which the test values corresponding to the output variables output can be obtained when the input variable input$_1$ is set to be the left end point input$_{1L}$, the middle point input$_{1M}$ and the right end point input$_{1R}$ of the interval, the input variable input$_2$ may be set to be a fixed value in its own change interval [input$_{2L}$, input$_{2R}$], and preferably, be the left end point input$_{2L}$ or the right end point input$_{2R}$ of its own change interval. A mean value of the test values output$_L$ and output$_R$ corresponding to the output variable output when the input variable input$_1$ are set to be the left end point input$_{1L}$ and the right end point input$_{1R}$ of its change interval may be computed. In a preferred embodiment, a logarithmic operation may be taken firstly on the two test values before the computation of the mean value, so it may be described in the following formula:

$$\text{output}_{AVG\_log} = \frac{\text{output}_{L\_log} + \text{output}_{R\_log}}{2}$$

where output$_{L\_log}$ is the value of the logarithm of the test value output$_L$, output$_{R\_log}$ is the value of the logarithm of the test value output$_R$, and output$_{AVG\_log}$ is the calculated mean value.

Then a relative error between the mean value and the test value output$_M$ corresponding to the output variable output when the input variable input$_1$ is set to be the middle point input$_{1M}$ of its change interval may be computed. Of course, a logarithmic operation may also be taken on the test value output$_M$, so it may be described in the following formula:

$$\text{error} = \left| \frac{\text{output}_{AVG\_log} - \text{output}_{M\_log}}{\text{output}_{M\_log}} \right| \times 100\%$$

where output$_{M\_log}$ is the value of the logarithm of the test value output$_M$, and error is the calculated relative error.

When the relative error error of the input variable input$_1$ in the interval [input$_{1L}$, input$_{1R}$] is less than or equal to a preset error precision ERROR, the division of interval may be stopped, at this point, the step length of the input variable input$_1$ is the length of the interval [input$_{1L}$, input$_{1R}$], that is, input$_{1R}$−input$_{1L}$. When the relative error error of the input variable input$_1$ in the interval [input$_{1L}$, input$_{1R}$] is greater than the error precision ERROR, the interval [input$_{1L}$, input$_{1R}$] may be equally divided into two intervals [input$_{1L}$, input$_M$] and [input$_M$, input$_{1R}$], and the relative errors of the two intervals may be computed according to the method mentioned above respectively. If there is an interval in the two intervals [input$_{1L}$, input$_M$] and [input$_M$, input$_{1R}$] whose relative error is greater than the error precision ERROR, the interval with the relative error greater than the error precision ERROR may be continually and equally divided into two intervals and the relative errors thereof may be calculated respectively. Such equal division operation may be stopped when the relative errors of all the divided intervals are less than or equal to the error precision ERROR. Finally, the length of the divided interval having the smallest length may be regarded as the step length of the input variable input$_1$. The computed step length of the input variable input$_1$ is labeled as $\Delta_1$.

Then according to the step length $\Delta_1$ of the input variable input$_1$, the step length of the input variable input$_2$ may be computed, and the step length of the input variable input$_2$ may be labeled as $\Delta_2$. In an embodiment, the step length $\Delta_2$ of the input variable input$_2$ may be computed with the following formula:

$$\Delta_2 = \left| \frac{MIV_1}{MIV_2} \right| \times \Delta_1$$

Finally, points may be taken on the change interval [input$_{1L}$, input$_{1R}$] of the input variable input$_1$ with its step length $\Delta_1$, and points may be taken on the change interval [input$_{2L}$, input$_{2R}$] of the input variable input$_2$ with its step length $\Delta_2$. Specifically, when taking points on the change interval [input$_{1L}$, input$_{1R}$] of the input variable input$_1$, the points may be equally taken from the left end point input$_{1L}$, and the distance between two sampled points is the step length $\Delta_1$, so the sample point set of the input variable input$_1$ is {input$_{1L}$, input$_{1L}$+$\Delta_1$, input$_{1L}$+2×$\Delta_1$, input$_{1L}$+3×$\Delta_1$, ... }. In an embodiment, if the right end point input$_{1R}$ fails to be taken, the right end point input$_{1R}$ may be added into the sample point set of the input variable input$_{1L}$, so the sample point set of the input variable input$_{1L}$ may be {input$_{1L}$, input$_{1L}$+$\Delta_1$, input$_{1L}$+2×$\Delta_1$, input$_{1L}$+3×$\Delta_1$, ..., input$_{1R}$}. The sample point set of the input variable input$_{1R}$ may be obtained in a similar way by sampling points on the change interval [input$_{2L}$, input$_{2R}$] of the input variable input$_2$ with its step length $\Delta_2$, which will not be repeated here.

Figure 3:
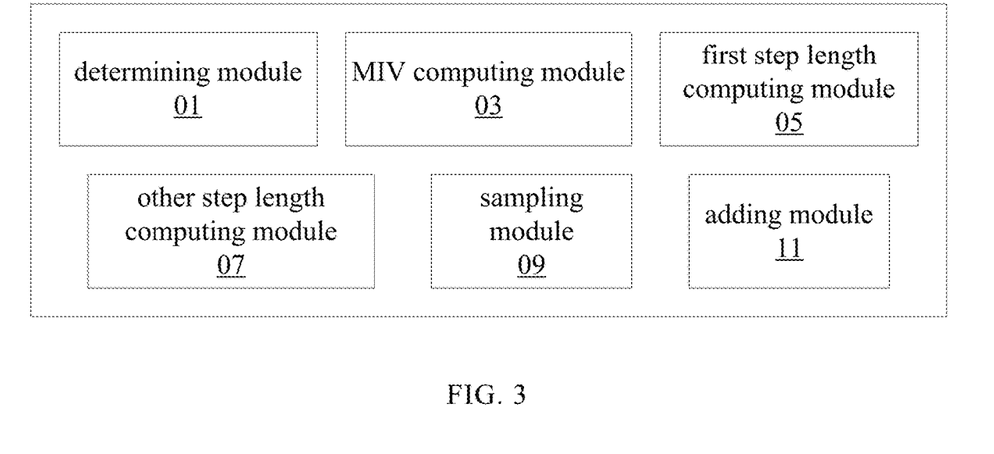
FIG. 3 is a schematic structural diagram of an apparatus for selecting neural network modeling samples for an IC device according to an embodiment of the present application.

The method for selecting neural network modeling samples for an IC device disclosed in the present application is described above; accordingly, the present application further provides an apparatus for selecting neural network modeling samples for an IC device (hereinafter referred to as a sample selection apparatus). Referring to FIG. 3, the sample selection apparatus in the present application may include a determining module 01, a MIV computing module 03, a first step length computing module 05, other step length computing module 07, a sampling module 09 and an adding module 11, which are specifically described below.

The determining module 01 is configured for determining one or more input variables, output variables and a change interval of each input variable for the IC device to be modeled.

The MIV computing module 03 is configured for computing a mean impact value of each input variable separately.

Figure 4:
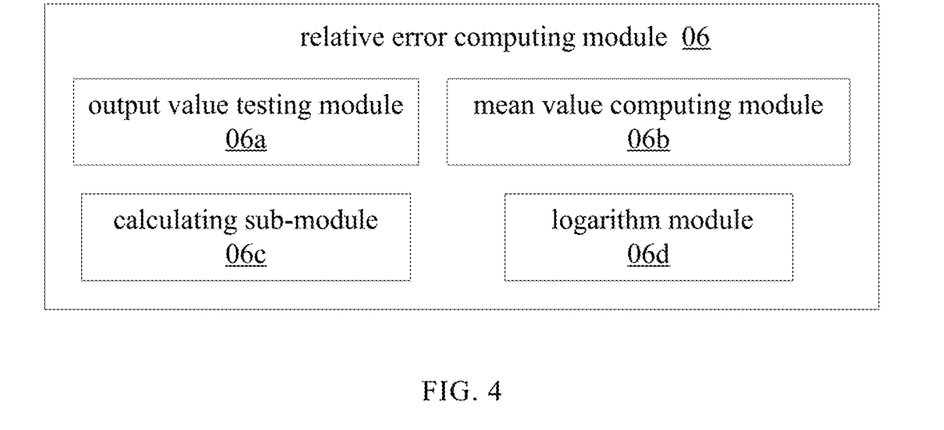
FIG. 4 is a schematic structural diagram of the first size length computing module in an apparatus for selecting neural network modeling samples for an IC device according to an embodiment of the present application.

The first step length computing module 05 is configured for computing a relative error of the change interval for the input variable with the largest MIV. When the relative error is less than or equal to a preset error precision, the length of the change interval of the input variable may be regarded as the step length of the input variable; and when the relative error is greater than the error precision, equally dividing the change interval of the input variable into two sub-intervals, and computing the relative errors of the two sub-intervals respectively. If there is a sub-interval whose relative error is greater than the preset error precision, continually and equally dividing it into two sub-intervals and computing relative errors of the two sub-intervals respectively until the relative errors of all the sub-intervals are less than or equal to the preset error precision, at this point, stopping equally dividing, and taking the length of the sub-interval having the smallest interval length as the step length of the input variable. In an embodiment, referring to FIG. 4, the first step length computing module 05 may include a relative error computing module 06 which is configured for computing the relative error of an input variable on an interval. The relative error computing module 06 may include an output value testing module 06a, a mean value computing module 06b, a calculating sub-module 06c and a logarithm module 06d. The output value testing module 06a is configured for obtaining, the test values corresponding to the output variables by means of an actual test when the input variable are set to be the left end point, the middle point, and the right end point of the interval respectively. The mean value computing module 06b is configured for computing a mean value of the abovementioned test values corresponding to the output variables when the input variables are set to be the left end point and the right end point of the interval. The calculating sub module 06c is configured for calculating a relative error between the mean value and the test value corresponding to the output variable when the input variable is set to be the middle point of the interval. The logarithm module 06d is configured for taking a logarithmic operation firstly on the test value when computing the mean value in the mean value computing module 06b and computing the relative error in the calculating sub-module 06c. The logarithm module 06d is an optional module, because when modeling the IC device, depending on the electrical characteristics of the IC device, the meaningful change interval of each input variable may correspond to an output variable whose value is in a large order of magnitude, generally greater than $10^5$. Thus, if the absolute error of the value of the output variable is directly used as a criterion of the error, the given standard absolute error value is difficult to meet the accuracy requirement of the output at different orders of magnitude, which will eventually result in taking too much or too little points in a certain interval. In this way, in a preferred embodiment, the logarithm module 06d may perform a logarithmic operation firstly on each test value when computing the mean value in the mean value computing module 06b and computing the relative error in the calculating sub-module 06c.

The other step length computing module 07 is configured for, according to the step length of the input variable having the largest MIV, computing the step lengths of other input variables respectively. In an embodiment, when the other step length computing module 07 is used for the computation of the step length of any other input variable, it may divide the MIV of the input variable having the largest MIV by the MIV of the input variable to be computed, and then multiply with the step length of the input variable having the largest MIV.

The sampling module 09 is configured for, for each input variable, taking points based on its change interval and step length to obtain a sample point set for each input variable.

The adding module 11 is configured for, for each input variable, taking points based on its change interval and step length, when the end points of the change interval of the input variable fails to be taken, and adding the end points of the change interval of the input variable into the sample point set of each input variable. The adding module 11 is an optional step, and the purpose of which is to maximize the information about the boundary, avoiding the loss of information at the boundary and misconvergence of the model.

The above described the method and the apparatus for selecting neural network modeling samples for an IC device. It can be seen that, during the sample selection, the error calculation of the divided intervals generated in the iteration will not be repeated, and there is no need to sort the relative error of the divided intervals generated in the iteration. When the complexity of the process is relatively high, the calculation efficiency is higher. With the present disclosure, a low amount of sample data may be selected under the condition of a given precision (i.e. error precision), avoiding the increase of test cost due to excessive training sample set or avoiding inaccurate training results caused by a too small sample set. Moreover, since the output value of the electrical characteristics of an IC device is in a large order of magnitude, a logarithmic operation is performed on the test result in the present application, making the present application more suitable for processing in the field of IC devices. When modeling according to the present application, it has the advantages of high precision but low sample data amount.

The effect of the sample selection method and apparatus of the present application may be verified by a specific example below.

The example takes a double-gate non-junction device with a channel length of 20 nm as the device to be modeled, the determined input variables of interest are $V_{gs}$ and $V_{ds}$, the output variable is $I_{ds}$, wherein the determined input variable $V_{gs}$ has a change interval of [−0.1V, 0.9V] and the input variable $V_{ds}$ has a change interval of [0.25V, 1.05V].

Using the MIV method, the calculated mean influence value $MIV_1$ of the input variable $V_{gs}$ is −0.0987, the mean influence value $MIV_2$ of the input variable $V_{ds}$ is −0.0096. Since $MIV_1$ is greater than $MIV_2$, the step length $\Delta_1$ of the input variable $V_{gs}$ may be calculated according to the sample selection method and apparatus of the present application. During which, the value of the input variable $V_{gs}$ may be set to be the left end point 0.25 of its change interval [0.25V, 1.05V].

When the error precision is preset to 0.5%, the step size $\Delta_1$ of the input variable $V_{gs}$ can be calculated to be 0.015, and the step size $\Delta_2$ of the input variable $V_{ds}$ can be further calculated to be approximately equal to 0.154.

When the error precision is preset to 0.1%, the step size $\Delta_1$ of the input variable $V_{gs}$ can be calculated to be 0.008, and the step size $\Delta_2$ of the input variable $V_{ds}$ can be further calculated to be approximately equal to 0.082.

When the step size $\Delta_1$ of the input variable $V_{gs}$ is between 0.008 and 0.015, correspondingly, the step size $\Delta_2$ of the input variable $V_{ds}$ is also between 0.082 and 0.154, then the error accuracy of the modeling which uses the resulted sample point set may be between 0.1% and 0.5%.

Figure 5:
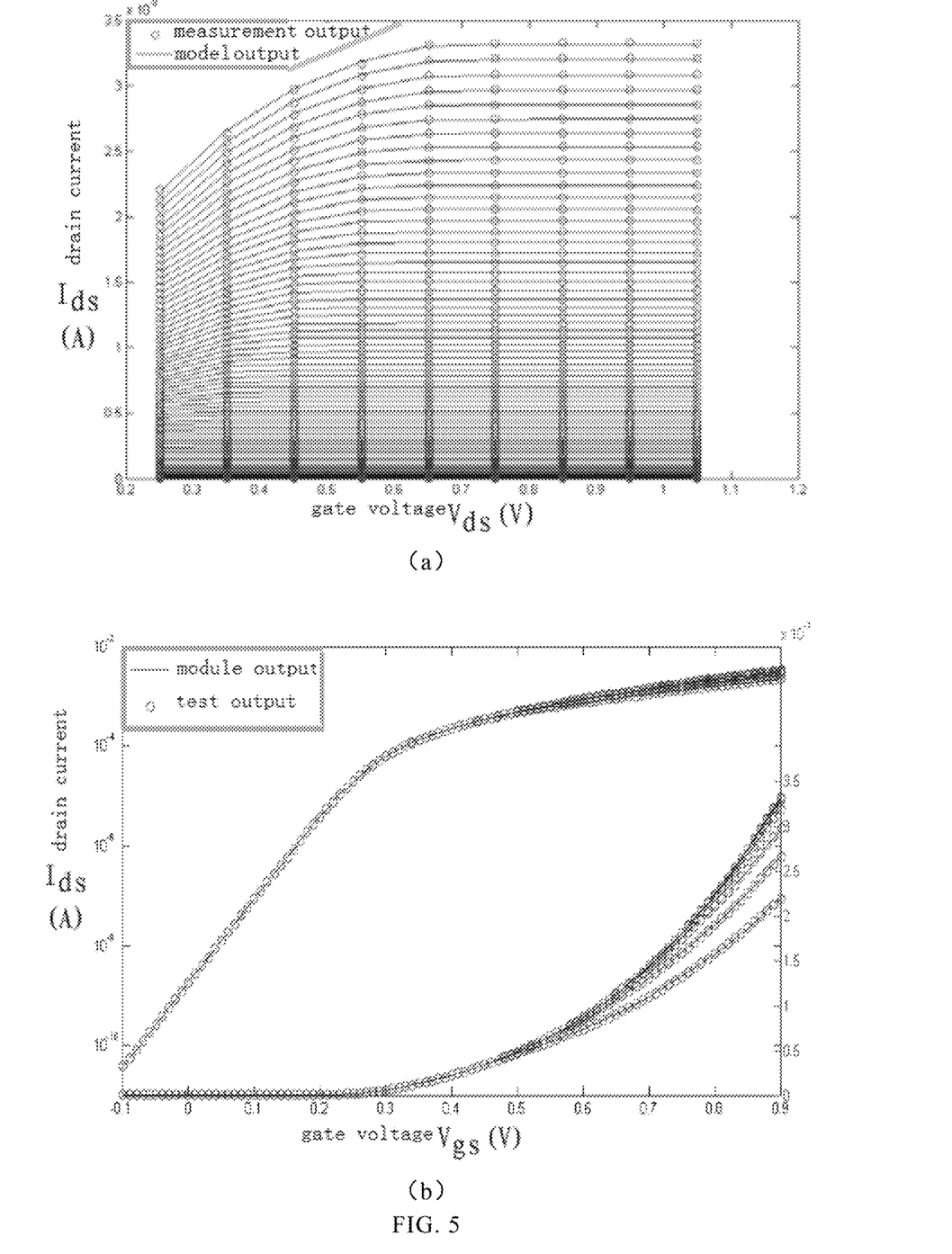

For example, the step size $\Delta_1$ of the input variable $V_{gs}$ is between 0.008 and 0.015, specifically $\Delta_1$ is 0.01, and correspondingly, $\Delta_2$ is 0.10; according to the step length $\Delta_1$ of the input variable $V_{gs}$, points may be sampled on the change interval [−0.1 V, 0.9V] of the input variable $V_{gs}$ according to step length $\Delta_1$ of the input variable $V_{gs}$, and points may be sampled on the change interval [0.25V, 1.05V] of the input variable $V_{ds}$ according to step length $\Delta_2$ of the input variable $V_{ds}$, obtaining the sample point set of the neural network. Then the neural network may be configured and be trained by the sample point set. FIG. 5 is a training result diagram, wherein FIG. 5(a) is a comparison diagram of the output variables $I_{ds}$ to the input variables $V_{ds}$ between a result from modeling test and a result from actual test, and FIG. 5(b) is a comparison diagram of the output variables $I_{ds}$ to the input variables $V_{gs}$ between a result from modeling test and a result from actual test. It can be seen that the accuracy of the obtained training result (i.e., the error precision) which is 0.3% is between 0.1% and 0.5%, which verifies the effect of the present application.

In turn, the error precision is preset to 0.3%. According to the sample selection method and apparatus of the present application, the step length $\Delta_1$ of the input variable $V_{gs}$ is exactly equal to 0.01 and the step length $\Delta_2$ of the input variable $V_{ds}$ is exactly equal to 0.10. This further verifies the effect of the present application.

Therefore, according to the sample selection method and apparatus as well as the selected sample point set of the present application, the model of the above-mentioned double-gate non-junction device finally obtained after modeling may be applied to actual circuit simulation analysis.

The above content is a further detailed description of the present application in conjunction with the specific embodiments, and the specific implementation of the present application is not limited to the description. For those skilled in the art to which the present invention pertains, a number of simple deductions or substitutions may be made without departing from the inventive concept.

The invention claimed is:

1. A method for selecting neural network modeling samples for an integrated circuit device, comprising:
    determining one or more input variables, output variables and a change interval of each input variable for the integrated circuit device to be modeled;
    computing a mean impact value of each input variable separately;
    for the input variable having the largest mean influence value, computing a relative error of its change interval, when the relative error is less than or equal to a preset error precision, using the length of the change interval of the input variable as the step length of the input variable; when the relative error is greater than the error precision, dividing the change interval of the input variable into two sub-intervals, and computing the relative errors of the two sub-intervals respectively; when there is a sub-interval whose relative error is greater than the preset error precision, continually and equally dividing it into two sub-intervals and computing relative errors of the two sub-intervals respectively until the relative errors of all the sub-intervals are less than or equal to the preset error precision, at this point, stopping equally dividing, and taking the length of the sub-interval having the smallest interval length as the step length of the input variable;
    according to the step length of the input variable having the largest mean influence value, computing the step lengths of other input variables respectively; and
    for each input variable, taking points based on its change interval and step length to obtain a sample point set for each input variable.

2. The method for selecting neural network modeling samples for an integrated circuit device according to claim 1, wherein the step of computing the relative error of an interval for an input variable comprises:
    by means of an actual test, obtaining the test values corresponding to the output variables when the input variable are set to be the left end point, the middle point, and the right end point of the interval respectively;
    computing a mean value of the abovementioned test values corresponding to the output variables when the input variables are set to be the left end point and the right end point of the interval; and
    computing a relative error between the mean value and the test value corresponding to the output variable when the input variable is set to be the middle point of the interval.

3. The method for selecting neural network modeling samples for an integrated circuit device according to claim 2, wherein a logarithmic operation may be taken firstly on each test value when computing the mean value and the relative errors.

4. The method for selecting neural network modeling samples for an integrated circuit device according to claim 1, wherein the computation of the step length of any other input variable is to divide the mean influence value of the input variable having the largest mean influence value by the mean influence value of the input variable to be computed, and then multiply with the step length of the input variable having the largest mean influence value.

5. The method for selecting neural network modeling samples for an integrated circuit device according to claim 1, wherein for each input variable, points is taken based on its change interval and step length, and when the end points of the change interval of the input variable fails to be taken, the end points of the change interval of the input variable is added into the sample point set of each input variable.

6. An apparatus for selecting neural network modeling samples for an integrated circuit device, comprising:
    a determining module configured for determining one or more input variables, output variables and a change interval of each input variable for the IC device to be modeled;
    a mean influence value computing module configured for computing a mean impact value of each input variable separately;
    a first step length computing module configured for computing a relative error of the change interval for the input variable having the largest mean influence value, when the relative error is less than or equal to a preset error precision, using the length of the change interval of the input variable as the step length of the input variable; when the relative error is greater than the error precision, dividing the change interval of the input variable into two sub-intervals, and computing the relative errors of the two sub-intervals respectively; when there is a sub-interval whose relative error is greater than the preset error precision, continually and equally dividing it into two sub-intervals and computing relative errors of the two sub-intervals respectively until the relative errors of all the sub-intervals are less than or equal to the preset error precision, at this point, stopping equally dividing, and taking the length of the sub-interval having the smallest interval length as the step length of the input variable;
    an other step length computing module configured for computing the step lengths of other input variables respectively according to the step length of the input variable having the largest mean influence value; and a sampling module configured for taking points based on the change interval and step length of each input variable to obtain a sample point set for each input variable.

7. The apparatus for selecting neural network modeling samples for an integrated circuit device according to claim 6, wherein the first step length computing module comprises a relative error computing module configured for computing the relative error of an input variable on an interval, the relative error computing module comprises:

an output value testing module configured for obtaining the test values corresponding to the output variables by means of an actual test when the input variable are set to be the left end point, the middle point, and the right end point of the interval respectively;

a mean value computing module configured for computing a mean value of the abovementioned test values corresponding to the output variables when the input variables are set to be the left end point and the right end point of the interval; and a calculating sub-module configured for calculating a relative error between the mean value and the test value corresponding, to the output variable when the input variable is set to be the middle point of the interval.

8. The apparatus for selecting neural network modeling samples for an integrated circuit device according to claim 7, wherein the relative error computing module further comprises a logarithm module configured for taking a logarithmic operation firstly on each test value when the mean value computing module is computing the mean value and the calculating sub-module is computing the relative error.

9. The apparatus for selecting neural network modeling samples for an integrated circuit device according to claim 6, wherein when the other step length computing module is computing the step length of any other input variable, it divides the mean influence value of the input variable having the largest mean influence value by the mean influence value of the input variable to be computed, and then multiply with the step length of the input variable having the largest mean influence value.

10. The apparatus for selecting neural network modeling samples for an integrated circuit device according to claim 6, further comprising an adding module configured for, for each input variable, taking points based on its change interval and step length, when the end points of the change interval of the input variable fails to be taken, and adding the end points of the change interval of the input variable into the sample point set of each input variable.

* * * * *